United States Patent

Katti et al.

[11] Patent Number: 5,436,861
[45] Date of Patent: Jul. 25, 1995

[54] VERTICAL BLOCH LINE MEMORY

[75] Inventors: Romney R. Katti, Pasadena; Henry L. Stadler, La Canada; Jiin-chuan Wu, San Gabriel, all of Calif.

[73] Assignee: California Institute of Technology, Calif.

[21] Appl. No.: 905,878

[22] Filed: Jun. 29, 1992

[51] Int. Cl.⁶ .............................................. G11C 19/08
[52] U.S. Cl. .......................................... 365/29; 365/87
[58] Field of Search ............................. 365/29, 87, 130

[56] References Cited

U.S. PATENT DOCUMENTS

| | | | |
|---|---|---|---|
| 4,122,538 | 10/1978 | Lins | 365/29 |
| 5,031,140 | 7/1991 | Hidaka | 365/29 |
| 5,105,383 | 4/1992 | Saito et al. | 365/29 X |

OTHER PUBLICATIONS

Vertical Bloch Line Memory by R. R. Katti, J. C. Wu and H. L. Stadler; 1990 NASA Space Engineering Research Center—Symposium on VLSI Design, pp. 8.3.1 to 8.3.20.
Integrated Vertical Bloch Line Memory by R. R. Katti, J. C. Wu and H. L. Stadler; 1990 NASA Technology 2000 Conference Proceedings, pp. 25–33.
Design and Characteristics for Vertical Bloch Line Memory Using Ring-Shaped Domain by H. Matsutera, K. Mizuno and Y. Hidaka; IEEE Transactions on Magnetics, vol. Mag-23, No. 5, Sep. 1987, pp. 2320–2325.
Operation of a VBL Memory Write Gate by J. C. Wu and F. B. Humphrey; IEEE Transactions on Magnetics, vol. Mag-21, No. 5, Sep. 1985, pp. 1773–1775.
Chip Organization of Bloch Line Memory by T. Suzuki, H. Asada, K. Matsuyama, E. Fujita, Y. Saegusa, K. Morikawa, K. Fujimoto, M. Shigenobu, K. Nakashi, H. Takamatsu, Y. Hidaka, and S. Konishi; IEEE Transactions on Magnetics, vol. Mag-22, No. 5, Sep. 1986, pp. 784–789.
Vertical Bloch Line Memory by F. B. Humphrey and J. C. Wu; IEEE Transactions on Magnetics, vol. Mag-21, No. 5, Sep. 1985, pp. 1762–1766.

*Primary Examiner*—Do Hyun Yoo
*Attorney, Agent, or Firm*—Leonard Tachner

[57] ABSTRACT

A new read gate design for the vertical Bloch line (VBL) memory is disclosed which offers larger operating margin than the existing read gate designs. In the existing read gate designs, a current is applied to all the stripes. The stripes that contain a VBL pair are chopped, while the stripes that do not contain a VBL pair are not chopped. The information is then detected by inspecting the presence or absence of the bubble. The margin of the chopping current amplitude is very small, and sometimes non-existent. A new method of reading Vertical Bloch Line memory is also disclosed. Instead of using the wall chirality to separate the two binary states, the spatial deflection of the stripe head is used. Also disclosed herein is a compact memory which uses vertical Bloch line (VBL) memory technology for providing data storage. A three-dimensional arrangement in the form of stacks of VBL memory layers is used to achieve high volumetric storage density. High data transfer rate is achieved by operating all the layers in parallel. Using Hall effect sensing, and optical sensing via the Faraday effect to access the data from within the three-dimensional packages, an even higher data transfer rate can be achieved due to parallel operation within each layer.

8 Claims, 18 Drawing Sheets

190 Oe

185 Oe

183 Oe (d) 175 Oe

VERTICAL BLOCH LINE MEMORY

ORIGIN OF INVENTION

The invention described herein was made in the performance of work under a NASA contract, and is subject to the provisions of Public Law 96-517 (35 USC 202) in which the Contractor has elected to retain title.

TECHNICAL FIELD

The present invention relates generally to vertical Bloch line memory systems and more particularly to improvements in such memory systems. The improvements relate to read gate design, methods of reading data and a three-dimensional configuration for increasing volumetric storage efficiency.

BACKGROUND ART

Vertical Bloch Line (VBL) Memory is a recently conceived, integrated, solid-state, block-access, VLSI memory which offers the potential of 1 Gbit/cm$^2$ areal storage density, gigabit per second data rates, and sub-millisecond average access times simultaneously at relatively low mass, volume, and power values when compared to alternative technologies. VBLs are micromagnetic structures within magnetic domain walls which can be manipulated using magnetic fields from integrated conductors. The presence or absence of VBL pairs are used to store binary information. At present, efforts are being directed at developing a single-chip memory using 25 Mbit/cm$^2$ technology in magnetic garnet material which integrates, at a single operating point, the writing, storage, reading and amplification functions needed in a memory. The densities are a function of stripe width and line feature width, which are defined respectively by the magnetic garnet material and the lithographic process.

In a VBL memory, information is stored using VBL pairs in magnetic stripe domains in magnetic garnets. The presence or absence of a vertical Bloch line pair in a bit-cell location defines a binary "1" and "0", respectively. Input to the chip is performed by converting currents into magnetic bubbles and then into VBL pairs. Output sensing is performed by converting VBL pairs into magnetic bubbles and sensing magnetic bubbles magnetoresistively.

One prior art design uses the magnet garnet, (BiYGdHoCa)$_3$(FeGeSi)$_5$O$_{12}$, as the storage medium. The thickness, stripe width, collapse field, saturation magnetization, and anisotropy field of the film is approximately 2.4 μm, 2.4 μm, 230 Oe, 450 Oe, and 1800 Oe, respectively. The film is grown epitaxially on a non-magnetic gadolinium-gallium-garnet (GGG) substrate. These films are transparent but also have a large Faraday rotation, so that magnetic stripes, magnetic bubbles, and, under certain conditions, VBLs can be observed magneto-optically with polarized light using the Faraday effect in a polarized light microscope.

The magnetic garnet has perpendicular magnetic anisotropy so that magnetization lies perpendicular to the film plane, with the bulk of the film magnetized in one direction, and the stripes in the opposite direction. A magnetic domain wall is the boundary between the stripe magnetization and the magnetization of the rest of the film. A twist of magnetization in the domain wall in the plane of the film is a VBL, and two such twists form a VBL pair. If the chirality, or sense of rotation, of the VBLs in the wall is the same, the VBL pair is stable, with a size calculated to be much less than 1 μm. The VBL pair is bound together energetically by VBL demagnetizing field energy and magnetic exchange energy.

A number of articles on VBL memory have been published are listed herein by way of background reference:

1. "Vertical Bloch Line Memory" by R. R. Katti, J. C. Wu and H. L. Stadler; 1990 NASA Space Engineering Research Center—Symposium on VLSI Design, pgs. 8.3.1 to 8.3.20.
2. "Integrated Vertical Bloch Line Memory" by R. R. Katti, J. C. Wu and H. L. Stadler; 1990 NASA Technology 2000 Conference Proceedings, pgs. 25-33.
3. "Design and Characteristics for Vertical Bloch Line Memory Using Ring-Shaped Domain" by H. Matsutera, K. Mizuno and Y. Hidaka; IEEE Transactions on Magnetics, Vol. Mag-23, No. 5, September 1987, pgs. 2320-2325.
4. "Operation of a VBL Memory Write Gate" by J. C. Wu and F. B. Humphrey; IEEE Transactions on Magnetics, Vol. Mag-21, No. 5, September 1985, pgs. 1773-1775.
5. "Chip Organization of Bloch Line Memory" by T. Suzuki, H. Asada, K. Matsuyama, E. Fujita, Y. Saegusa, K. Morikawa, K. Fujimoto, M. Shigenobu, K. Nakashi, H. Takamatsu, Y. Hidaka, and S. Konishi; IEEE Transactions on Magnetics, Vol. Mag-22, No. 5, September 1986, pgs. 784-789.
6. "Vertical Bloch Line Memory" by F. B. Humphrey and J. C. Wu; IEEE Transactions on Magnetics, Vol. Mag-21, No. 5, September 1985, pgs. 1762-1766.

STATEMENT OF THE INVENTION

In accordance with the present invention, improvements are made in vertical Bloch line (VBL) memory. These improvements include the following:

A new read gate design for the vertical Bloch line (VBL) memory is disclosed which offers larger operating margin than the existing read gate designs. In the existing read gate designs, a current is applied to all the stripes. The stripes that contain a VBL pair are chopped, while the stripes that do not contain a VBL pair are not chopped. The information is then detected by inspecting the presence or absence of the bubble. The margin of the chopping current amplitude is very small, and sometimes non-existent.

In the improved design, all the stripes are chopped independently of whether they contain a VBL pair or not. The information is then detected by inspecting the state number of the bubbles. The bubble generated from a stripe with a VBL pair has two VBLs in it, and the bubble generated from a stripe without a VBL pair has no VBLs. The bubbles containing two VBLs propagate in the direction of the magnetic field gradient, while the bubbles containing no VBLs (unichiral bubbles) propagate at roughly 45 degrees to the field gradient. Thus, a sorter can be used to separate the unichiral bubbles from the bubbles containing two VBLs, so that all the unichiral bubbles are removed from the data string before it reaches the bubble detector. This improvement has a wide chopping current margin and improves the reliability of the read operation.

A new method of reading Vertical Bloch Line memory is also disclosed. Instead of using the wall chirality to separate the two binary states, the spatial deflection of the stripe head is used.

The dynamic motion of the stripe head may be utilized to improve the robustness of the readback process in VBL memory. The direction of motion of the stripe head depends on whether or not vertical Bloch lines exist in the stripe head. Upon stripe head expansion, the stripe head can then be located in one of two locations, depending on the presence or absence of vertical Bloch lines. The difference in location can then be used to separate binary data and achieve readback.

Also disclosed herein is a compact memory which uses vertical Bloch line (VBL) memory technology for providing data storage. A three-dimensional arrangement in the form of stacks of VBL memory layers is used to achieve high volumetric storage density. High data transfer rate is achieved by operating all the layers in parallel. Using Hall effect sensing, and optical sensing via the Faraday effect to access the data from within the three-dimensional packages, an even higher data transfer rate can be achieved due to parallel operation within each layer.

The proposed technology is solid-state and radiation hard. These features are expected to enhance reliability, into the hundreds of thousands of hours of operation before failure, and to facilitate the use of computer systems in harsh environments including spaceflight. The relative simplicity of this system is expected to eliminate potential problems that are present in the prior art, and to facilitate mass manufacturing.

OBJECTS OF THE INVENTION

It is therefore a principal object of the present invention to provide an improved vertical Bloch line memory wherein the improvement comprises a unique read gate which improves the reliability of the read operation.

It is an additional object of the invention to provide an improved vertical Bloch line memory wherein the improvement comprises a method of using the dynamic motion of the stripe to read binary data instead of relying on wall chirality to read data.

It is still an additional object of the invention to provide an improved vertical Bloch line memory utilizing a three-dimensional stack configuration of parallel operating VBL memory layers.

BRIEF DESCRIPTION OF THE DRAWINGS

The aforementioned objects and advantages of the present invention as well as additional objects and advantages thereof will be more fully understood hereinafter as a result of a detailed description of a preferred embodiment when taken in conjunction with the following drawings in which:

FIG. 1 comprising

FIG. 3 comprising

FIG. 7, comprising

FIG. 10, comprising

FIG. 11, comprising

FIG. 12, comprising

FIG. 13, comprising

DETAILED DESCRIPTION OF THE INVENTION

The prior art device is divided into four main functional areas. First, the VBL storage area is designed to confine and stabilize stripe domains. Second, read/write gates are needed to convert VBLs to bubbles which are used for input and output. Third, a major line is needed for propagating bubbles which are used for input and output. Fourth, the output detector is needed for generating the output signal voltage. A sample architecture for a VBL chip is shown schematically in FIG. 1.

Figure 2:
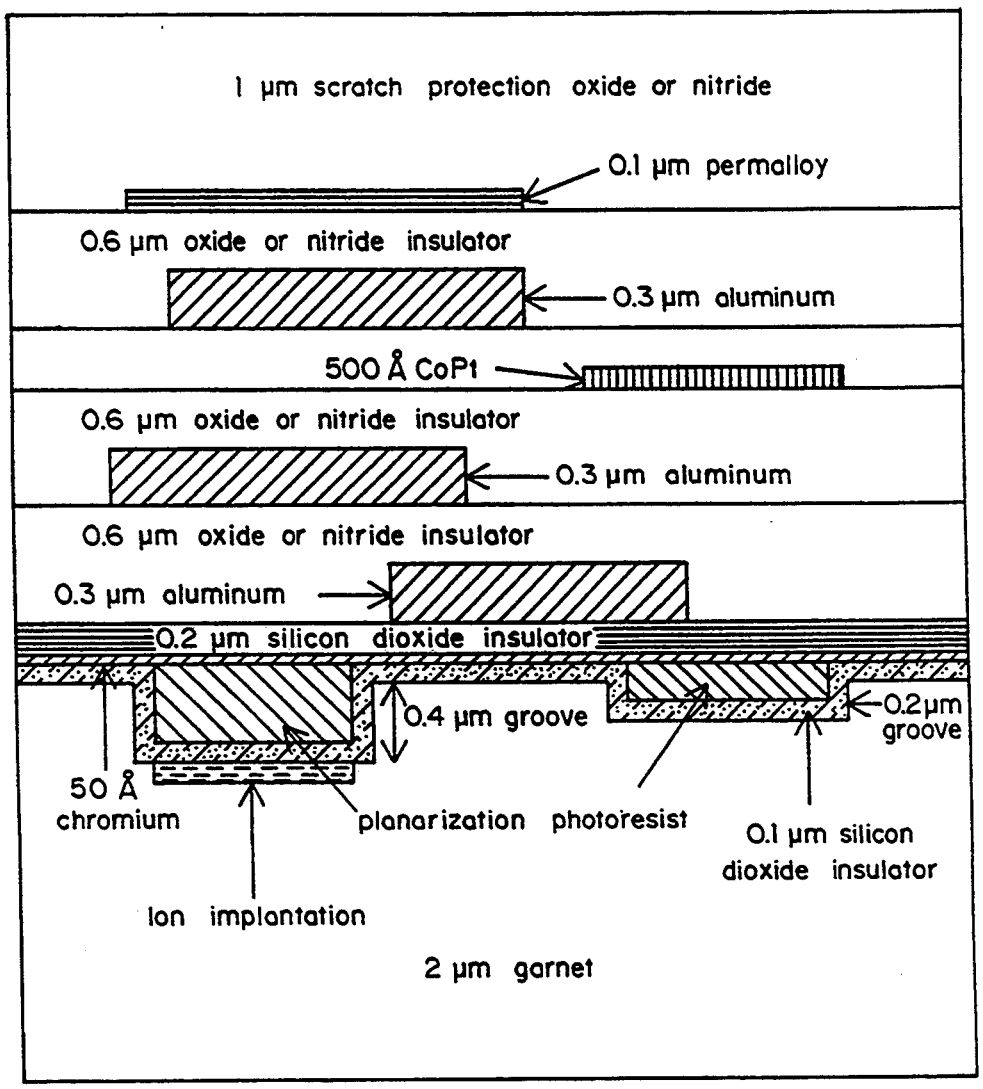
FIG. 2 is a cross-sectional drawing of a prior art VBL memory device.

The VBL memory is built with ten mask layers as shown in FIG. 2. Three metal mask layers are used for providing the contact pads and conductors which control the stripe generator, read/write gates, bubble generator, and major line. $SiO_2$ and photoresist are used for insulating metal layers, and a window mask is used to open vias and contacts when needed between metal layers. Two ion implantation mask steps, using 150 keV $Ne^+$ ions at a dosage of $4 \times 10^{15}$ ions/cm$^2$, are used so that, after etching, grooves which are 0.2 μm and 0.4 μm thick are created in the garnet film which create stable locations for VBL stripe domains in the presence of the applied bias field. An additional ion implantation mask layer is used in the major line to inhibit VBL formation in the input/output bubbles. A permalloy ($Ni_{0.8}Fe_{0.2}$) mask deposition is used to develop a magnetoresistive sensor which senses magnetic bubbles at the output and produces output voltages. A cobalt-alloy (i.e. CoPt) mask deposition is used for creating bit cells for VBL pairs along the walls of stripe domains. In test chips, a 5 nm thick Cr mirror layer is used to assist in stripe, bubble, and VBL observation using the magneto-optic Faraday effect during testing.

STRIPE AND BIT STABILIZATION

Figure 3A:
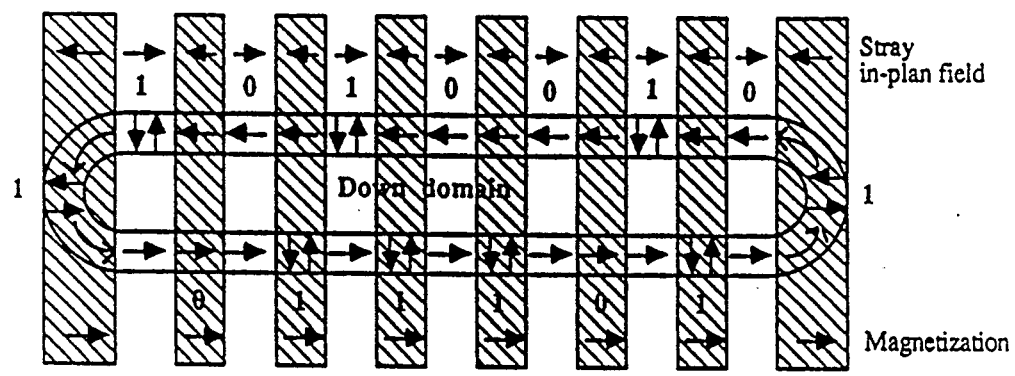
FIGS. 3(a) and 3(b) is a schematic illustration of a VBL stripe storage structure.
Figure 3B:
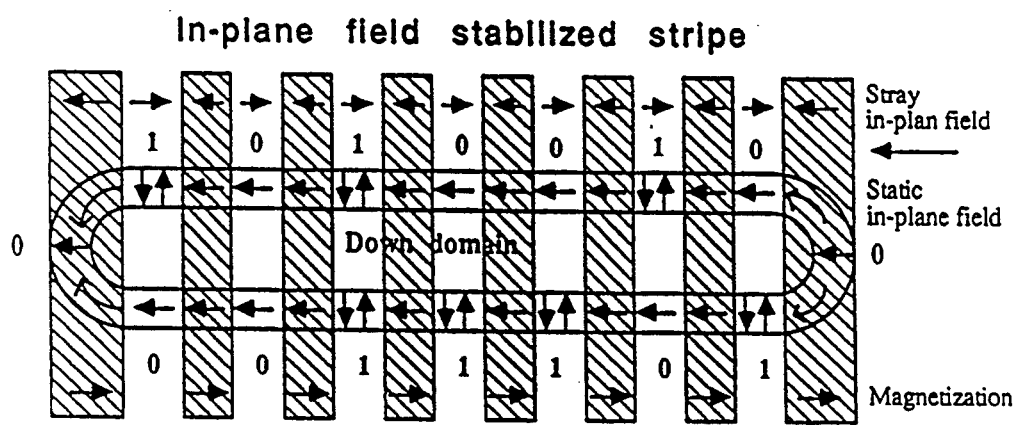

Data in the form of VBL pairs are stored in the domain walls of arrays of stripe domains as depicted in FIG. 3. The stripes are physically located in grooved regions in the garnet, as shown schematically in FIG. 1 and in the design layout in FIG. 4. The grooving allows selecting the bias field so that stripes are stable when the other chip functions, including the major line, are operating. The demagnetizing field produced by the bias field at the edge of grooved regions also serves to hold the stripe end and produce a stabilizing, effective edge-affinity magnetic field. Results from a supercomputer simulation of the formation of stable stripes in grooved garnet are shown in FIG. 5. The computations were performed at 1 nsec time steps, and the computed stripe domain shape is shown at 40 nsec intervals.

Figure 1A:
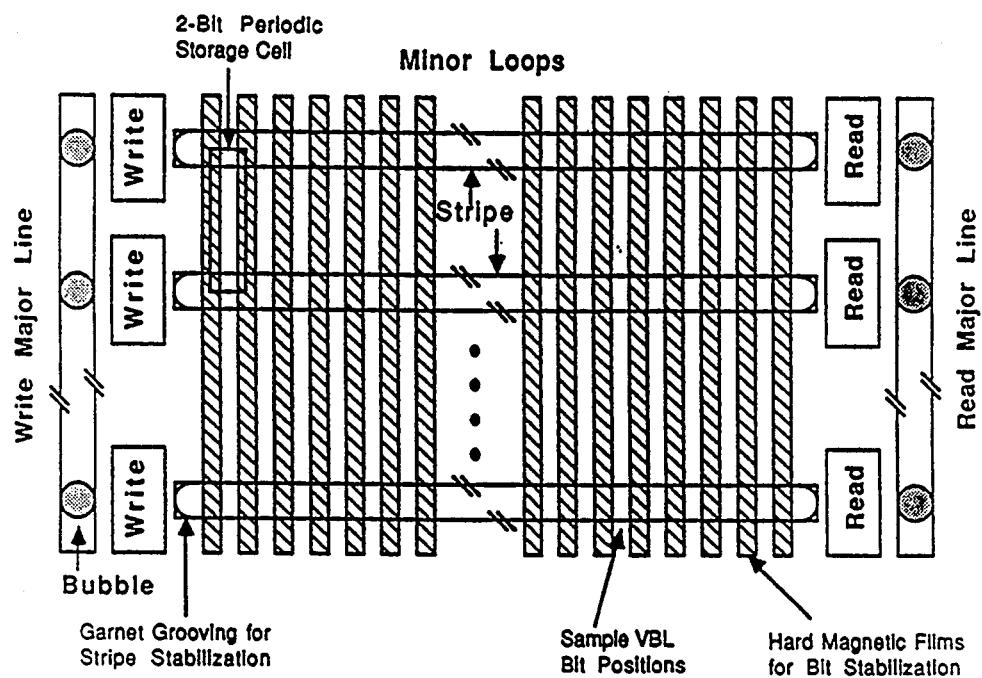
FIGS. 1(a) and 1(b) is a schematic illustration of a prior art vertical Bloch line memory architecture.
Figure 1B:
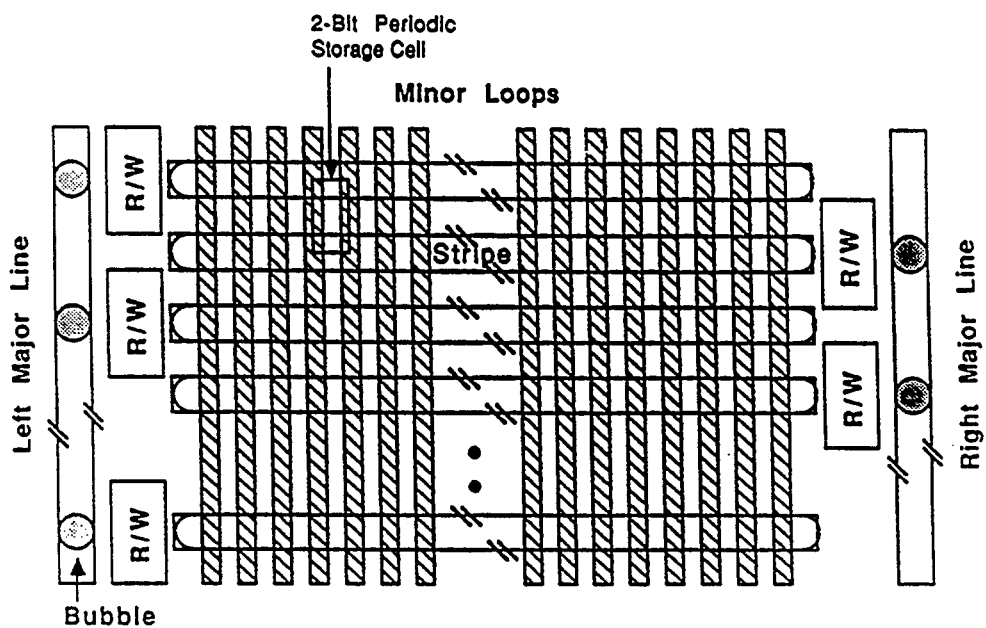
Figure 4:
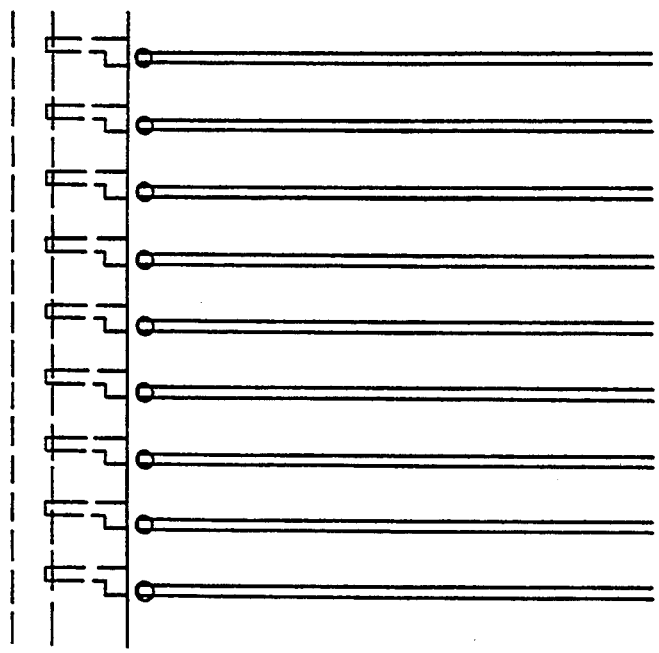
FIG. 4 is a layout drawing of VBL memory components.
Figure 5A:
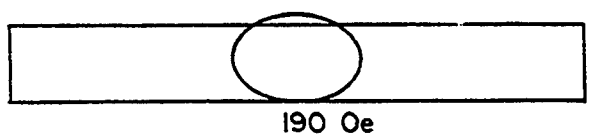
FIG. 5 comprising FIGS. 5(a) to 5(d) prior art is a drawing of computer simulation results of stable stripe formation.
Figure 5B:
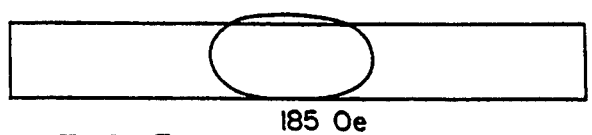
Figure 5C:
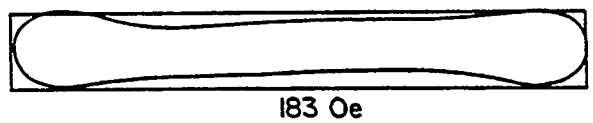
Figure 5D:
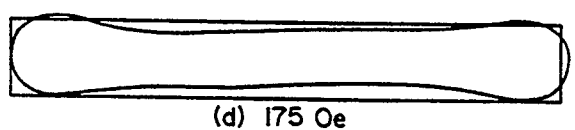
Figure 6:
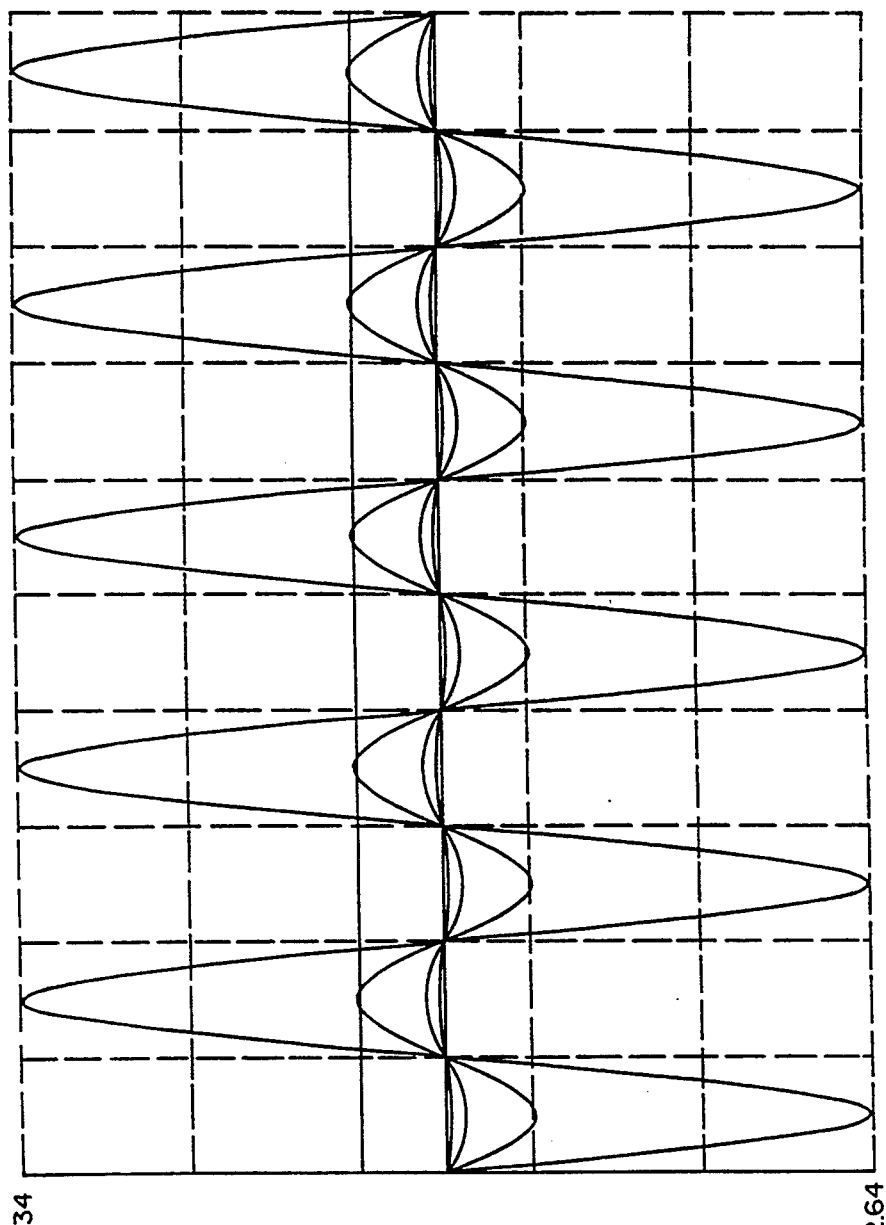
FIG. 6 is a graphical illustration of the computed periodic magnetic field profile of prior art VBL bit-stabilized wells.
Figure 7E:
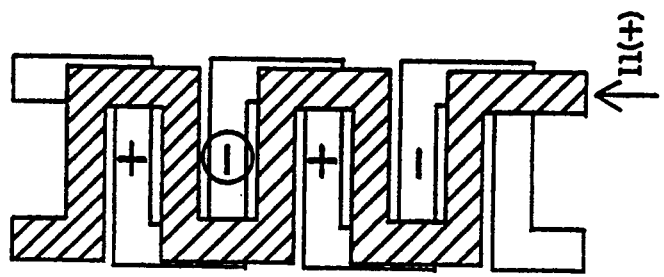
FIGS. 7a, 7b, 7c, 7d and 7e, is a schematic illustration used to explain the principle of operation of the major line in a prior art VBL memory.
Figure 7D:
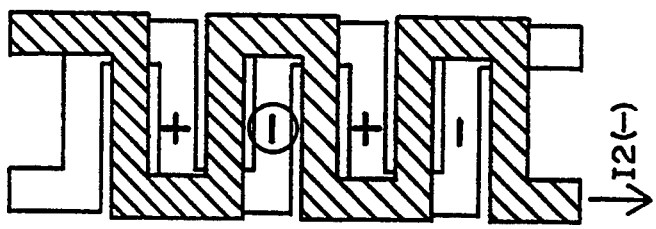
Figure 7C:
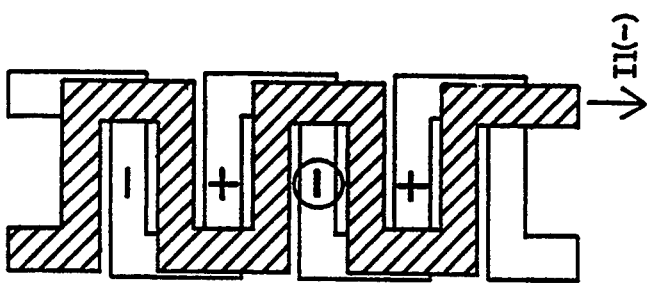
Figure 7B:
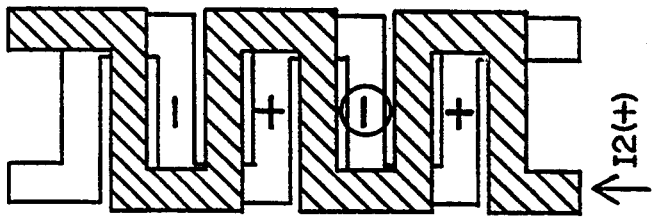
Figure 7A:
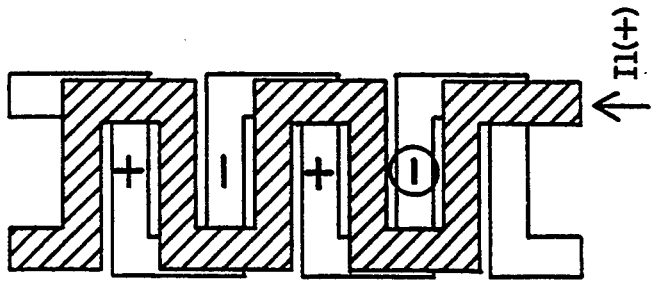

Bit stabilization is used to stabilize VBL pairs along the stripe, as shown in FIGS. 1, 3 and 4. A periodic potential is placed along the stripe by an array of CoPt bars. For the CoPt, the saturation magnetization, coercivity, geometry, and spacing from the garnet are chosen to provide a sufficient field of approximately 5 Oe at the VBL stripe. This field value is currently considered to be enough to provide fields which create potential wells for the VBL pairs without disrupting the VBL pairs and moving stripes away from their groove-stabilized positions. The computed bit stabilization field profile at the end of an array with a 2 $\mu$m bit period is shown in FIG. 6. The distance between the CoPt and the garnet film is a parameter in the graph. The periodicity in the field profile is clearly evident.

Propagation of the VBL pairs, around the bit cells and to the read/write gates, can be achieved in two ways. First, a vertical pulse field can be applied which presses, or rocks, the stripe against the groove wall which gyrotropically causes VBL pairs to propagate down the stripe. Second, an in-plane field can be applied which directly causes VBL pairs to advance along the stripes' walls.

READ/WRITE GATES

Read/Write gates are used to convert VBL pairs in stripes into bubbles during the read process, and convert bubbles into VBL pairs during the write process. It is necessary to read and write both "1's" and "0's" correctly. Nondestructive readback is presently achieved by using a current in conductors to bring the end of a stripe out of its groove into the read/write gate and into the presence of another conductor. If no VBL pair is present at the end of the stripe, the sense of the magnetization direction in the stripe wall causes the stripe to be difficult to chop with the field from a conductor because of exchange energy. The stripe is then returned to its stable position in the grooving. However, if a VBL pair is present, one VBL is brought into the read/write gate while the other VBL remains in the grooving, so the chirality of the stripe wall is in the same direction which readily allows it to be chopped. The chopped portion of the stripe becomes a bubble which can be propagated to the output for sensing, while the stripe returns to the grooved region and recreates a VBL pair leaving the information intact.

Writing is achieved by bringing a bubble from the nucleator and major line to the desired read/write gate. If a bubble is present, when the stripe is subjected to a field to bring it into the read/write gate, the stripe does not get drawn into the read/write gate because of magnetostatic repulsion between the bubble and the end of the stripe. Therefore, no writing to the stripe occurs. If a bubble is not present, the stripe is brought rapidly into the read/write gate which inserts a VBL pair into the stripe, and the stripe is then allowed to relax into the grooving.

MAJOR LINE AND OUTPUT DETECTOR

The major line consists of a bubble nucleator for converting input signal currents into bubbles, a track for propagating bubbles from the nucleator to the read/write gates and from the read/write gates toward the output, an output detector for converting the demagnetizing field from bubbles into output voltages, and an expander which is used to stretch a bubble to a desired length to provide a satisfactory signal-to-noise ratio at the output. These structures are now discussed.

A hairpin conductor is used for the nucleator. When a current is applied, such a conductor produces a magnetic field which is concentrated at the center of the hairpin. This field is used to generate bubbles which are used to transmit binary information to the VBL stripes via the read/write gates.

The propagation track in the major line consists of two levels of conductors. Each conductor is a serpentine arrangement of hairpin conductors which provide local magnetic field variations which form "waves" of stable positions for the bubbles down the track. The conductors are physically phase shifted by 90 degrees to effect propagation. The principle of operation of the major line is shown in FIG. 7. The layout of the major line track, along with the bubble nucleator and two read/write gates and grooves, is shown in FIG. 4.

Figure 8:
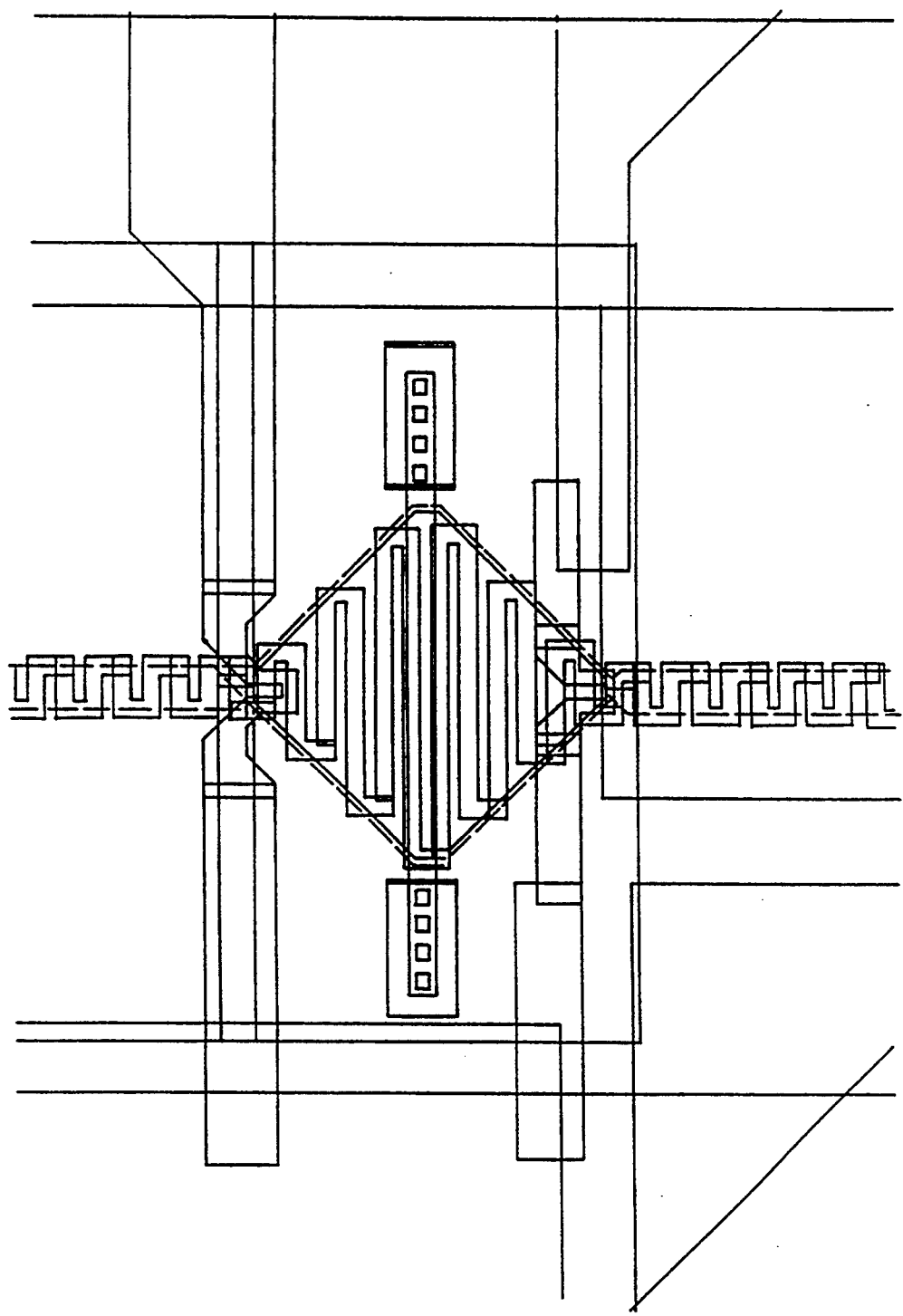
FIG. 8 is a layout drawing of a prior art VBL expander and output detector.
Figure 9:
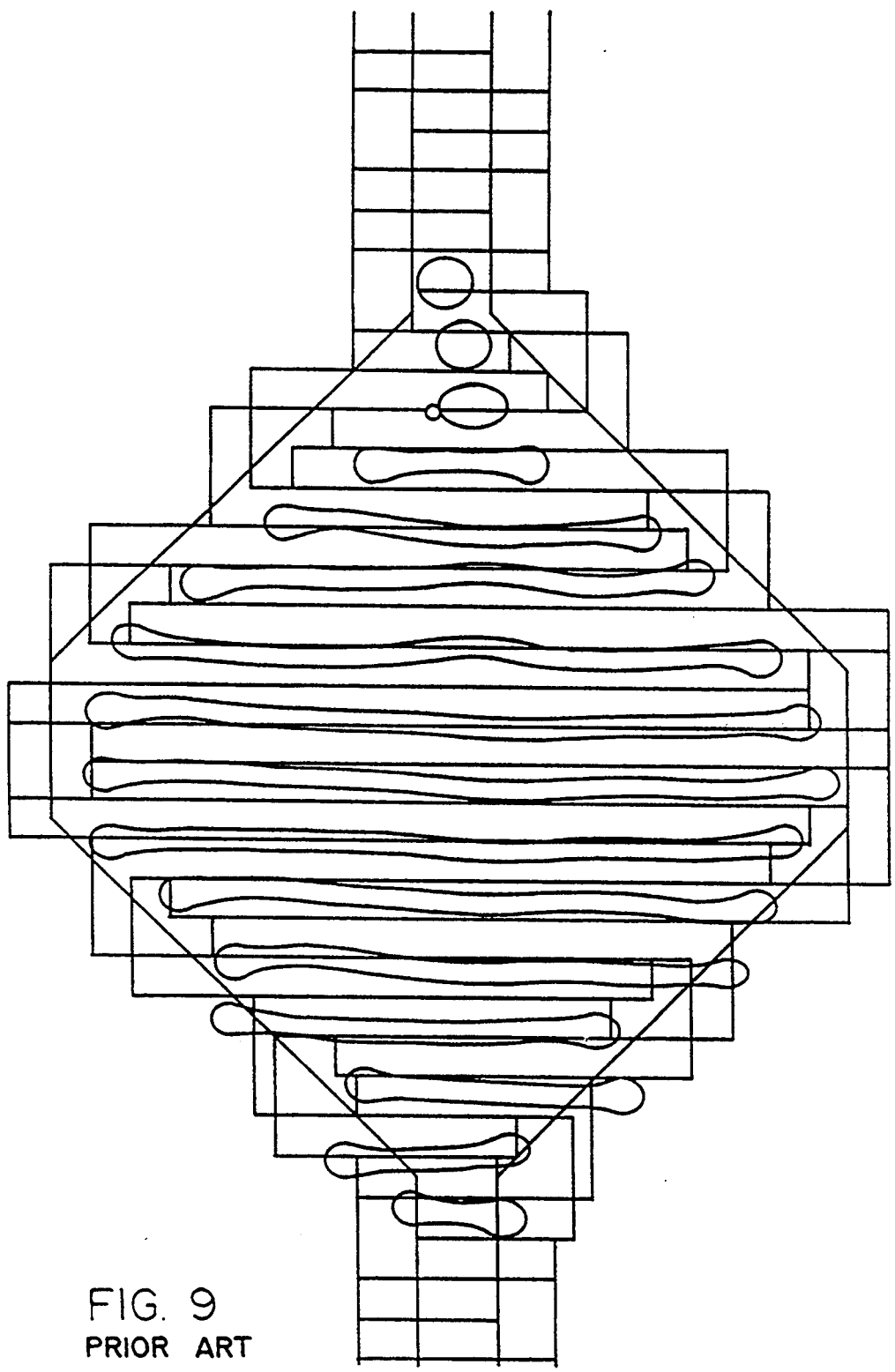
FIG. 9 is a drawing of a computer simulation of an expanding bubble in the major line expander and output detector of the prior art drawing of FIG. 8.

The output detector consists of a rectangular strip of permalloy which is magnetoresistive. When a magnetic field as from a magnetic bubble is placed near the sensor, the resistance changes. When a reference current is issued to the sensor, the presence or absence of a bubble induces two different voltage levels to be generated which define binary "1's" and "0's". If it is necessary to maximize common-mode rejection from stray magnetic fields, two magnetoresistive sensors, including the actual sensor and a dummy sensor are used which can be measured differentially. Since the signal from the magnetoresistive sensor is increased if longer elements with greater electrical resistance are used, the sensor length can be increased. Bubbles can be stretched in length to provide fields for the lengthened sensor by widening the bubble track as the bubble approaches the sensor. The combined output sensor and expanding major line are shown in FIG. 8, where only one propagation metal layer in the major line is shown for clarity. A supercomputer simulation, shown at 40 nsec intervals after being computed at 1 nsec intervals, of a bubble being stretched and then unstretched as it passes through the expander and detector is shown in FIG. 9.

The principle of the existing VBL memory read gate designs is further illustrated in FIG. 10. In FIG. 10a, four stripes are shown to contain a "1001" data pattern, where a VBL pair and no VBL pair in the stripe head represent a 1 and 0, respectively. During a read operation, the stripe head is stretched, and the VBL pair is separated into two single VBL's, located on the opposite sides of the chopping conductor, as shown in FIG. 10b. For the stripes that contain a VBL pair (e.g., stripes A and D), the magnetizations of the two side walls in the chopping conductor gap are parallel. For the stripes that contain no VBL pairs (e.g., stripes B and C), the magnetization of the two sides walls in the chopping conductor gap are anti-parallel. Due to the difference in the exchange energy of these two kinds of stripes, there is a slight difference in their chopping currents. The stripes having a parallel side wall magnetization are easier to chop. As shown in FIG. 10c, when the chopping current is less than $I_1$, none of the stripes are chopped. When the chopping current is between $I_1$ and $I_2$, some of the parallel-side-wall stripes are chopped. Between $I_2$ and $I_3$, all of the parallel-side-wall stripes are chopped and none of the antiparallel-side-wall stripes are chopped. Between $I_3$ and $I_4$, some of the antiparallel-side-wall stripes are chopped. At chopping currents larger than $I_4$, all of the stripes are chopped. Thus, if a chopping current of amplitude between $I_2$ and $I_3$ is applied to the stripes shown in FIG. 10b, then stripes A and D will be chopped and stripes B and C will not. The result is shown in FIG. 10d, where three bubbles are created to represent the "1001" data pattern. The information is then detected by inspecting the presence and absence of the bubble.

The margin of the chopping current amplitude is found to be very small and dependent on material. In many cases, the margin does not exist, i.e., $I_2$ is greater than $I_3$.

The solution is to use a current larger than $I_4$ to chop all the stripes. The resultant bubbles contain two or no VBLs, depending on whether the stripe head contains a VBL or not. The unichiral bubbles can be separated from the bubble string, so that the bubbles containing two VBLs represent the data pattern stored in the stripe. This new read method avoids the narrow margin problem of the existing read method and is independent of the material.

Figure 10B:
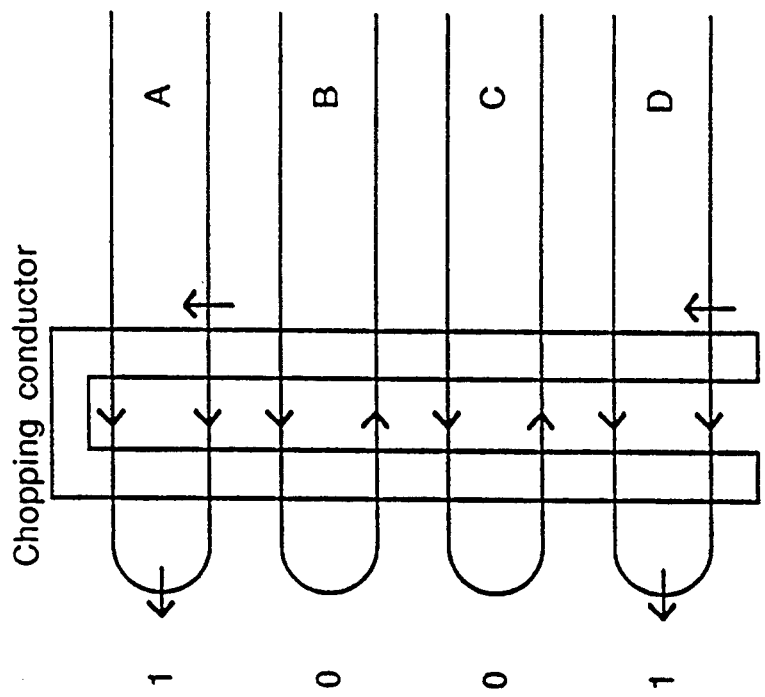
FIGS. 10a, 10b, 10c and 10d, is a drawing which depicts the read gate design principle of prior art VBL memories.
Figure 10A:
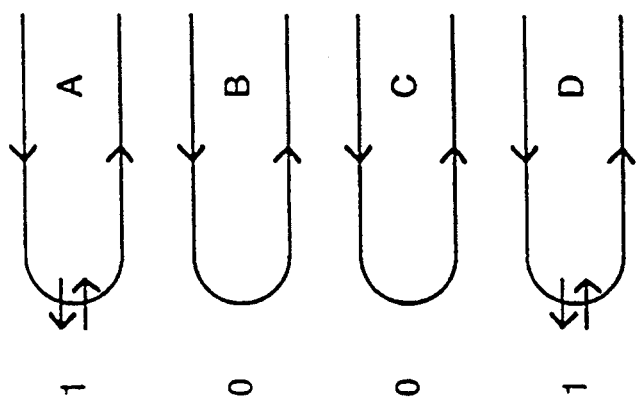
Figure 10D:
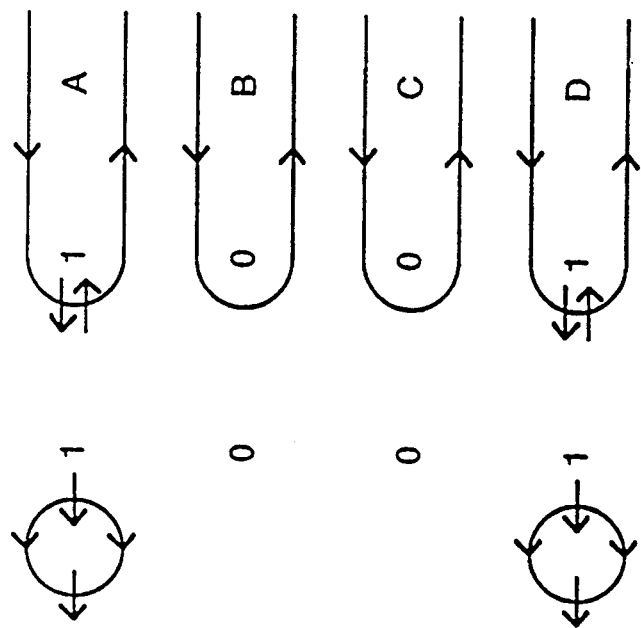
Figure 10C:
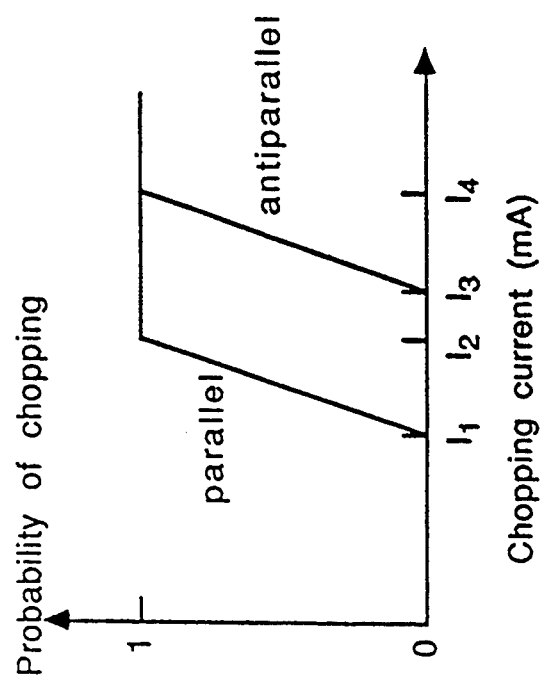
Figure 11B:
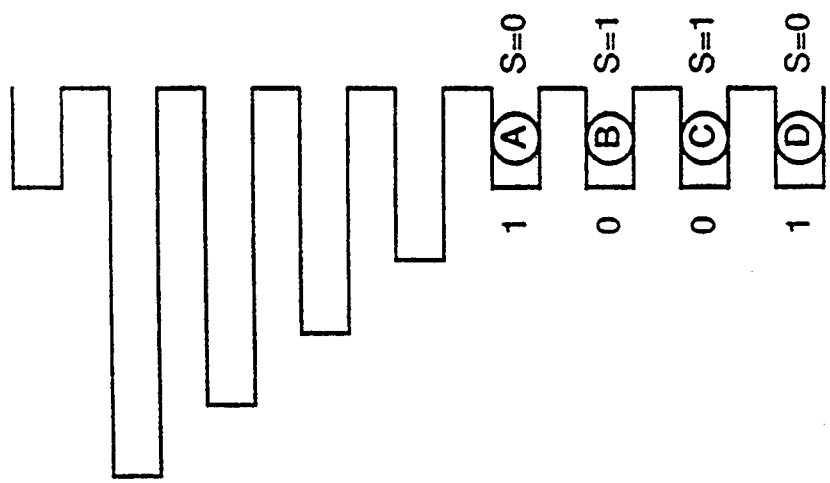
FIGS. 11a, 11b, 11c and 11d, is a drawing which depicts the operation of the improved VBL memory read gate design of the present invention.
Figure 11A:
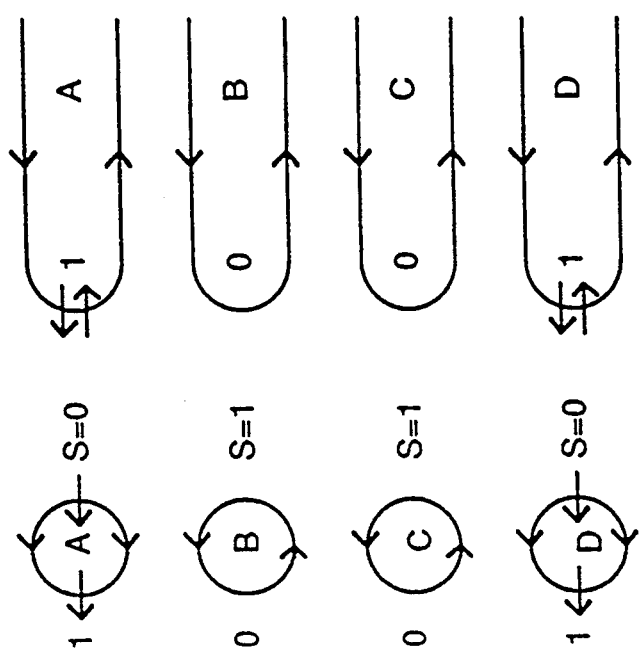
Figure 11D:
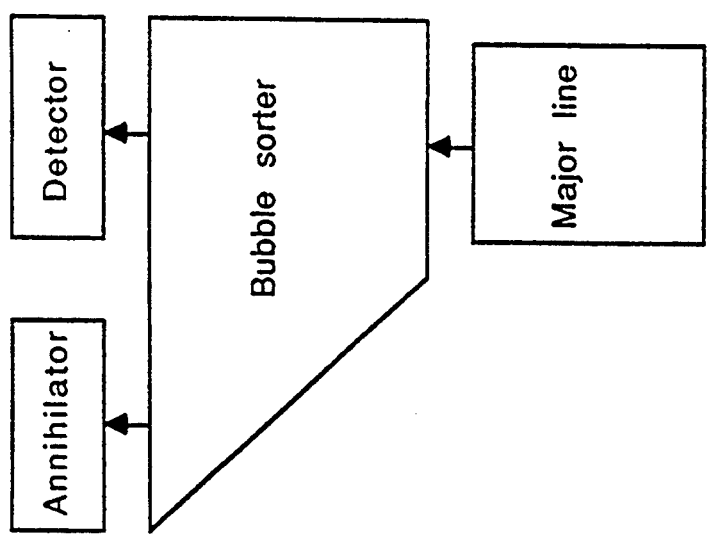
Figure 11C:
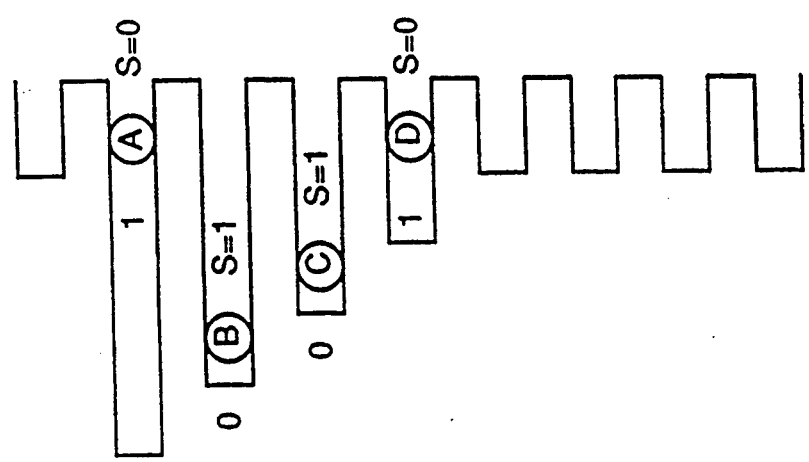

Assuming the same "1001" data pattern as shown in FIG. 10a, after applying a current larger than $I_4$ to chop all the stripes, the result is shown in FIG. 11a. The A and D bubbles, created from the A and D stripes, each contain two VBLs. The B and C bubbles, created from the B and C stripes, contain no VBL, making them unichiral bubbles (also called unchiral bubbles). A chiral bubble is a bubble whose wall contains a VBL pair. These four bubbles are propagated by a dual-conductor major line into the sorter, as shown in FIG. 11b, where only one layer of the meandering conductor pattern is shown. The sorter is the area where the width of the meander conductor gradually increases. The principle of the sorter operation is based on the gyrotropic deflection of the bubble propagation. For a bubble containing two VBLs, it propagates in the direction of the magnetic field gradient. For a bubble containing no VBLs, it propagates roughly at a 45 degree angle with respect to the field gradient direction. Therefore, after four propagation cycles, the B and C bubbles are on the left with respect to the A and D bubbles as shown in FIG. 11c. By placing the bubble detector in line with the straight propagation path, only the bubbles with two VBLs will be detected, thus producing the "1001" data pattern. A bubble annihilator is needed on the left hand side to collapse the bubbles with no VBLs as shown in FIG. 11d.

This reading scheme does not rely on the small difference between the chopping current of the two different side wall state stripes. The gyrotropic deflection of the bubble is a much more reliable method for detection.

Another read gate configuration makes use of the fact that, in general, the force exerted on a stripe head by a vertical magnetic field is directed at an angle $\alpha = \tan^{-1}(KS)$, where K is a constant and S is the net Chirality summed over the Bloch wall subjected to the field of the stripe expander conductor.

Figure 12A:
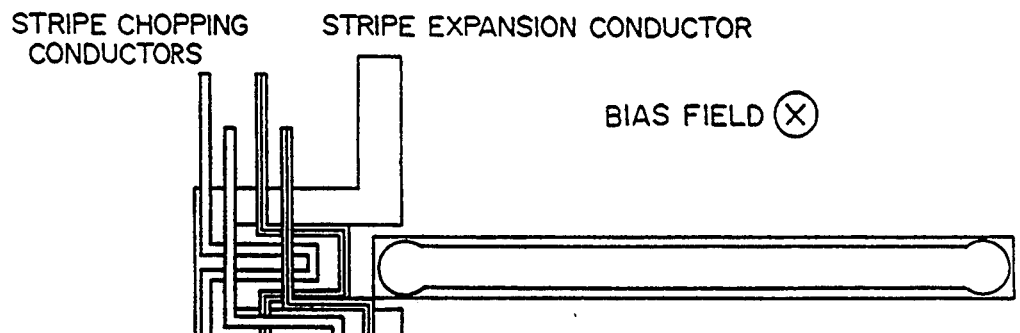
FIGS. 12a, 12b and 12c, is a sequential illustration of the improved method of reading VBL memory in accordance with the present invention wherein a stripe contains no Bloch pair.
Figure 12B:
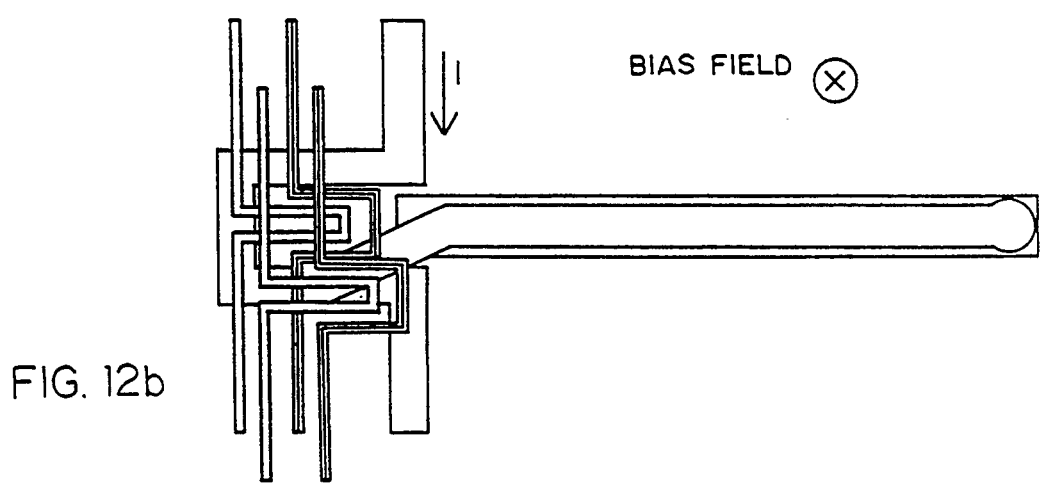
Figure 12C:
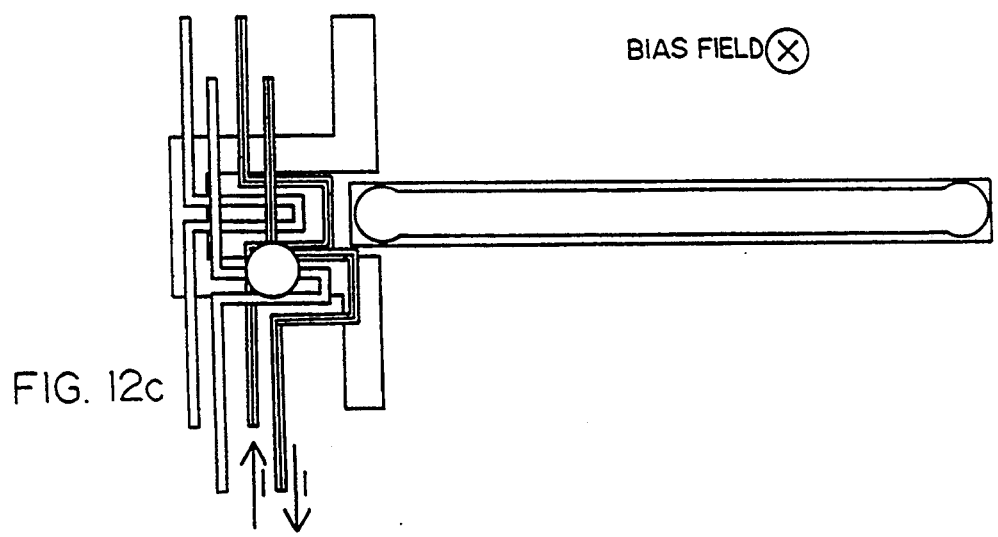

Assume that a stripe contains no Bloch pair, as shown in FIG. 12a. Thus, the wall is unichiral and $S \neq 0$, so $\alpha \neq 0$. Thus when the stripe expander conductor is energized, the stripe head deflects, as shown in FIG. 12b, and if the "B" chopping conductor is energized, will be cut, yielding a bubble, as shown in FIG. 12c, which bubble can be transferred through the major line and detected, producing an electronic signal unequal to Zero.

Figure 13A:
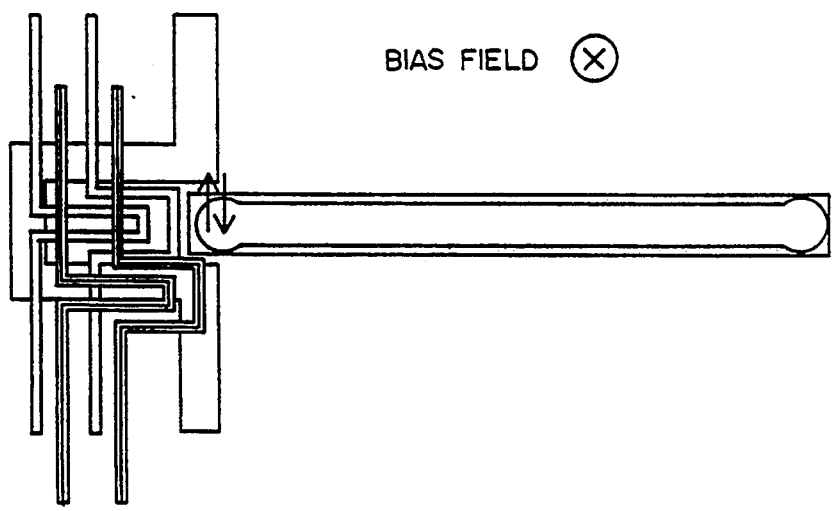
FIGS. 13a, 13b and 13c, is an illustration similar to that of FIG. 12 but wherein a stripe head does contain a Bloch line pair.
Figure 13B:
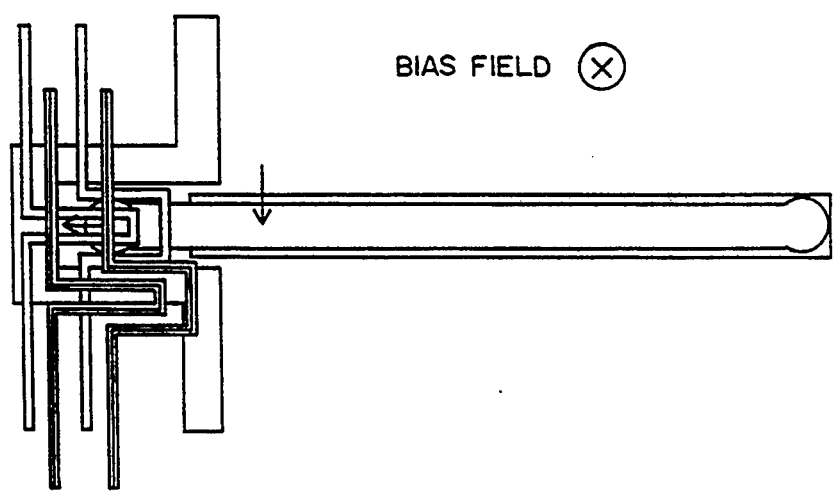

On the other hand, if it is assumed that there is a Bloch line pair in the stripe head as shown in FIG. 13a, it will be split as shown in FIG. 13b when the stripe expander conductor is pulsed, placing a single Bloch line near the head and reducing the net chirality sum, S, to zero, so $\alpha = 0$. Thus the stripe expands straight ahead, missing chopping conductor B and not being chopped by B when it is pulsed, so yielding no new bubble in the major line. Thus the electronic signal is zero.

Figure 13C:
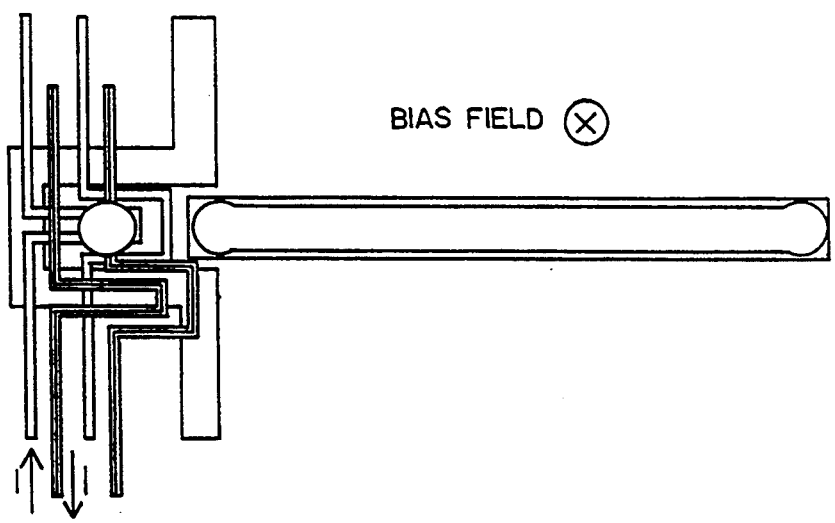

If it is preferred that a bubble be delivered to the major line if a VBL pair was present and not be delivered if the pair was not present, then conductor "A" can be pulsed instead of conductor "B", with the resulting bubble as shown in FIG. 13c.

In many applications, nonvolatile secondary memory is achieved by using magnetic disk recording. While areal density improvements are underway in magnetic recording, the fact that they are mechanical systems limits their reliability, volumetric data storage capacity, access time, data rate, and usefulness in harsh environments such as in spaceflight.

The solution to these problems, as described below, is to use the VBL memory chip as a module, which stores a two-dimensional array of VBLs. These modules are stacked to form a three-dimensional memory system. Each VBL memory module provides high reliability, large areal density, short access time, and radiation hardness. Since the VBL memory module chip is only 20 mil thick, the stacking of these chips provides a large volumetric storage capacity. Parallel read out can be performed across all the module and within each module. Thus, very high data transfer rate can be achieved.

Figure 14:
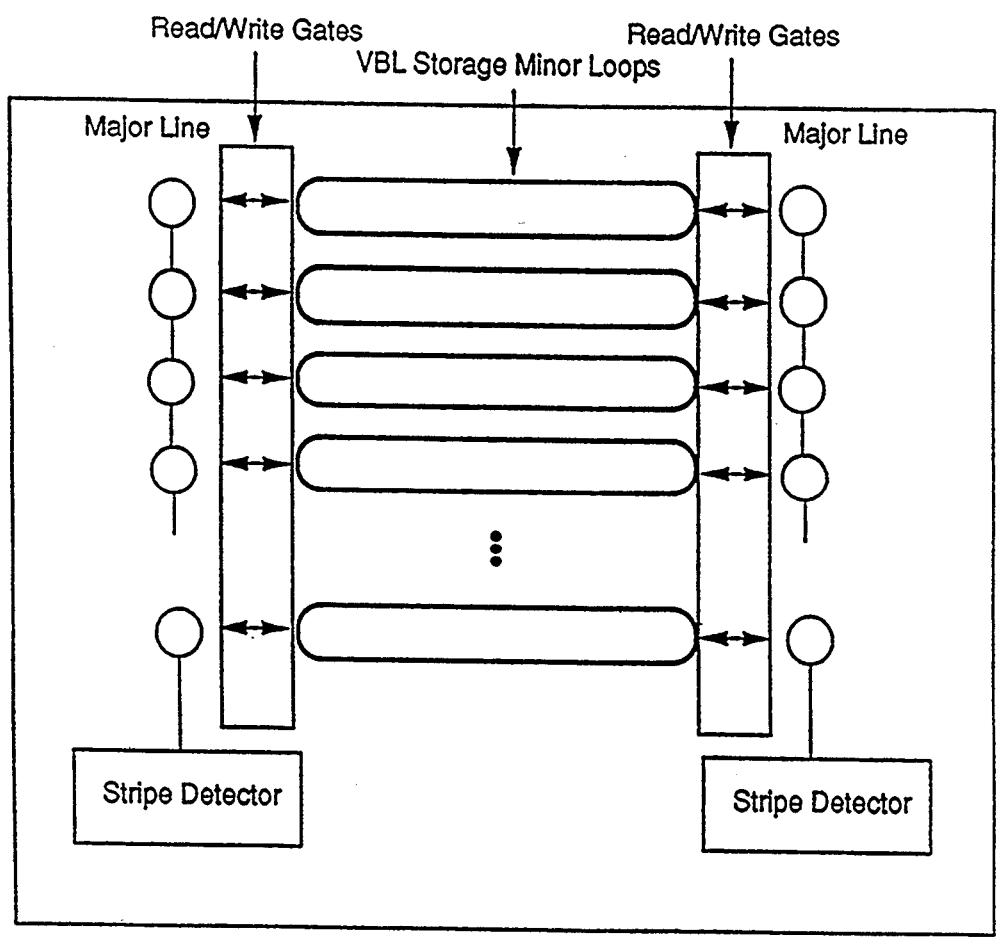
FIG. 14 is a schematic areal layout of a module used in the three-dimensional VBL memory system of the present invention.

The block diagram of a VBL memory module chip is shown in FIG. 14. The VBLs are stored in a linear array of parallel stripe domains which are called minor loops. The VBLs are propagated around the minor loops by a global magnetic pulse field. At both ends of the stripes, a structure called read/write gate is implemented on the chip to convert the presence and absence of a VBL in the minor loop into the presence and absence of a bubble in the major line, during the read back mode; and vice versa during the write mode. The bubbles in the major line are propagated into the stripe detector region and are expanded into long stripes. A magnetoresistive detector is deposited on the chip to detect the presence and absence of the magnetic stripe domains. For the sake of discussion, the data transfer rate of this module is L Mbit/sec.

Figure 15:
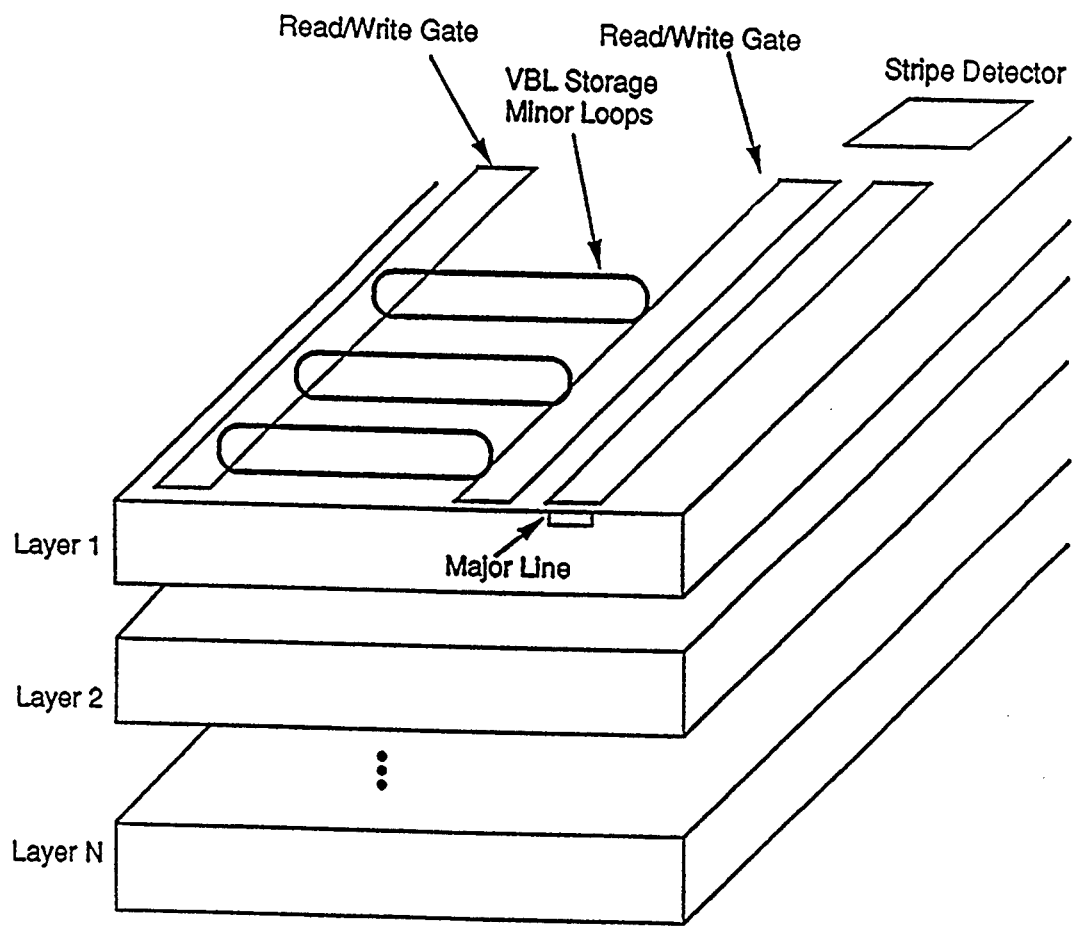
FIG. 15 is a three-dimensional view of a three-dimensional VBL memory of the invention wherein magnetoresistive readout is used.

FIG. 15 shows a view of a few modules in layers that comprise the three-dimensional memory system. The modules are stacked on top of each other. All the modules are operated in parallel. Therefore, the total data transfer rate in NxL Mbit/sec, where N is the number of modules in the memory system.

To further improve the data transfer rate of the 3-D memory system two other sensing methods can be used, namely, Hall effect sensing and optical sensing via the Faraday effect.

Figure 16:
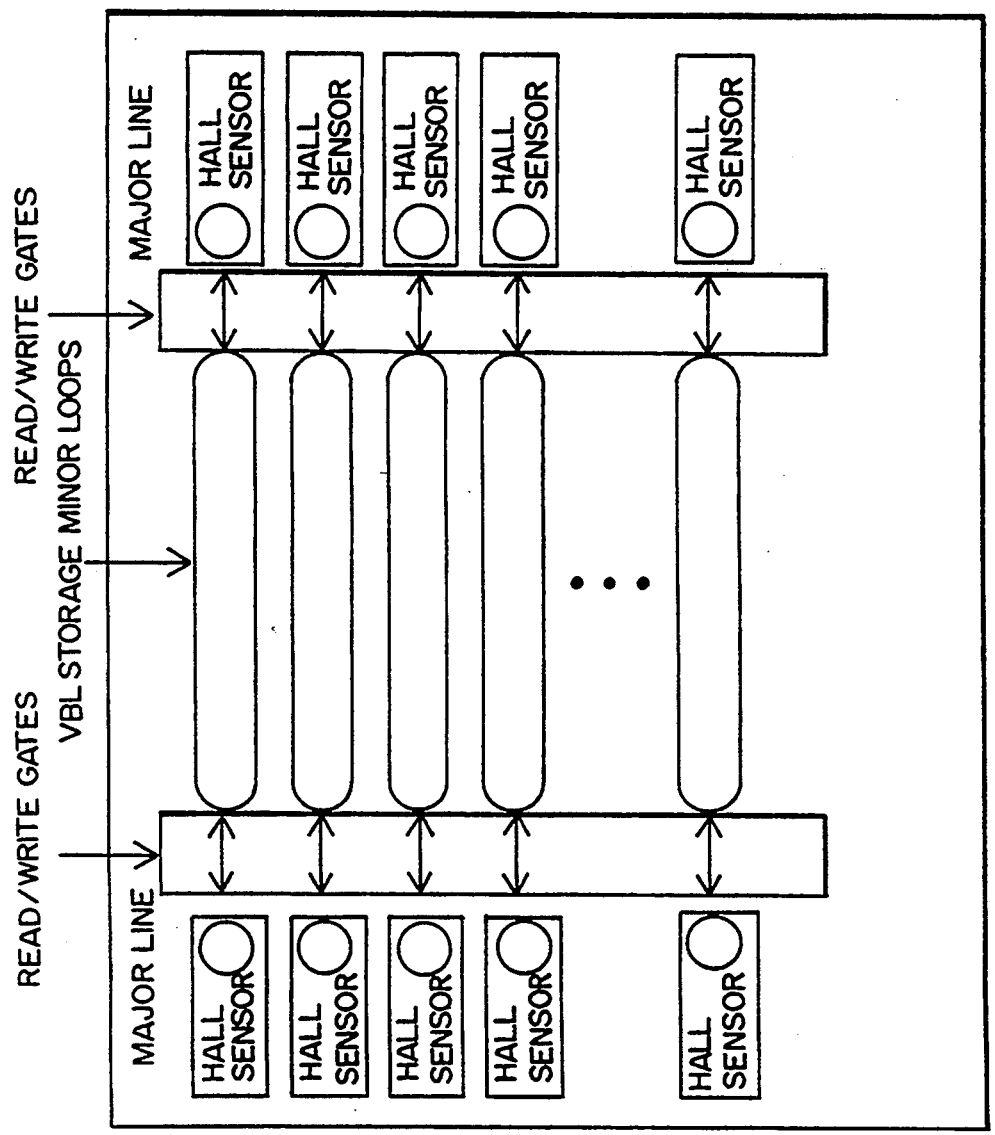
FIG. 16 is a schematic areal layout of a module for the three-dimensional VBL memory system using Hall effect sensing.

A block diagram of a VBL memory module using Hall effect sensing is shown in FIG. 16. Instead of propagating the bubbles in the major line to a stripe detector for serial data detection, Hall sensors are deposited on the major line to detect the bubbles in situ. One Hall sensor is needed for every minor loop so that the data transfer rate of each module is MxP Mbit/sec, where M is the number of the minor loops in a module and P is the data transfer rate of each minor loop. Because all the modules can be operated in parallel, the total data transfer rate is MxPxN Mbit/sec.

Figure 17:
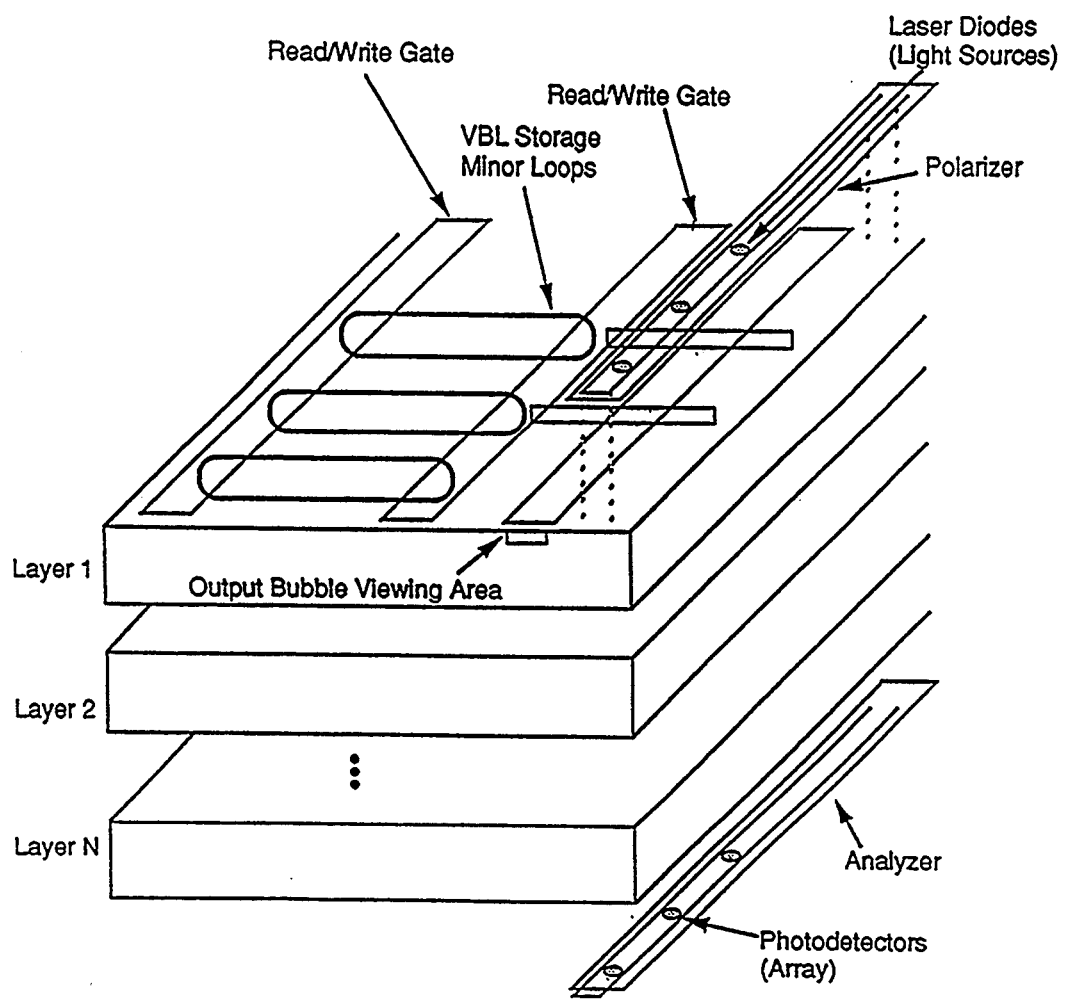
FIG. 17 is a three-dimensional view of the three-dimensional VBL memory system using optical readout.

A block diagram of a three-dimensional VBL memory system using optical sensing is shown in FIG. 17. The stack of the VBL memory module is placed between an array of laser diodes with a polarizer on one side and an array of photodetectors and an analyzer on the opposite end. The laser diode array and the polarizer serve as the light source. The analyzer and the photodetectors detect the presence and absence of the bubble in the memory module. One photodetector is needed for every minor loop, so that the data transfer rate of each module is MxQ Mbit/sec, where M is the number of the minor loops in a module and Q is the data transfer rate for each minor loop. Because the light goes through all the modules, and the photodetector can only detect the net polarization change, only one module can be read at a time. Therefore, the total data transfer rate is MxQ Mbit/sec. The advantage of this approach is that there is no need to deposit and pattern the sensor on the memory chip. Of course, alignment of the memory module, laser diodes, and photodetectors is necessary.

Having thus described various exemplary embodiments of the above-noted improvements, what is claimed is:

1. An improved data readback device for a vertical Bloch line (VBL) memory system of the type having a plurality of stripes, some of such stripes having a VBL pair representing a binary "1" and some of such stripes not having such a VBL pair, the absence of a VBL pair representing a binary "0"; the improvement comprising:
    a chopping conductor positioned relative to said stripes and carrying a chopping current of sufficient magnitude to chop all of the stripes of said memory system irrespective of whether a VBL pair is contained within each such stripe;
    said chopping conductor forming chiral bubbles from stripes having a VBL pair and forming unchiral bubbles from stripes not having a VBL pair;
    a bubble sorter for collapsing all of the unchiral bubbles; and
    a bubble detector for detecting bubbles having a VBL pair.

2. The improvement recited in claim 1 wherein said bubble sorter utilizes gyrotropic bubble deflection manifested by a difference in the direction of propagation of said chiral and unchiral bubbles relative to the direction of magnetic field gradient to collapse said unchiral bubbles.

3. The improvement recited in claim 1 further comprising a bubble annihilator to collapse the unchiral bubbles.

4. A method for improving the reliability of readback in VBL memory system of the type having a plurality of stripes, some of such stripes having a VBL pair representing a binary "1" and some of such stripes not having such a VBL pair, the absence of a VBL pair representing a binary "0"; the method comprising the steps of:
    (a) applying a chopping current to all of said stripes, said chopping current having a sufficient magnitude to chop all of the stripes of said memory system irrespective of whether a VBL pair is contained within each such stripe; said chopping current forming chiral bubbles from stripes having a VBL pair and forming unchiral bubbles from stripes not having a VBL pair;
    (b) sorting said chiral bubbles and said unchiral bubbles for collapsing all of said unchiral bubbles; and
    (c) detecting said chiral bubbles.

5. The method recited in claim 4 wherein said sorting step utilizes gyrotropic bubble deflection manifested by a difference in the direction of propagation of said chiral and unchiral bubbles relative to the direction of magnetic field gradient to collapse said unchiral bubbles.

6. The method recited in claim 4, wherein in said step (b) said collapsing is carried out by the step of annihilating said unchiral bubbles.

7. A method of reading data in a VBL memory system, the system of the type having a plurality of stripes in grooves of a magnetic material subjected to a bias magnetic field and further having a stripe expansion conductor adjacent an end of each such stripe and a first chopping conductor connected to a major line for propagating bubbles in said VBL memory system, the first chopping conductor being adjacent the expansion conductor for chopping an expanded stripe head in each said stripe for transferring a bubble onto the major line for determining whether a VBL pair is contained within such bubble, the presence or absence of a VBL pair being determinative of whether the corresponding stripe stored a binary "1" or "0", respectively; the method comprising the steps of:
    (a) providing a second chopping conductor not connected to said major line, said second chopping conductor being displaced from said first chopping conductor connected to said major line;
    (b) positioning said chopping conductors so that upon activation of said expansion conductor said stripe head expands into adjacency with either said second chopping conductor or said first chopping conductor connected to said major line depending upon whether said stripe has no VBL pair or has a VBL pair, respectively;
    (c) applying energy to said first chopping conductor connected to said major line for transferring a bubble containing a VBL pair to said major line.

8. The method recited in claim 7 wherein said step (b) is carried out by utilizing a gyrotropic bubble deflection resulting in said deflection of stripe heads having a VBL pair to locations different from stripe heads not having a VBL pair.

* * * * *